(12) United States Patent
Otsuka et al.

(10) Patent No.: US 8,233,265 B2
(45) Date of Patent: Jul. 31, 2012

(54) CERAMIC CAPACITOR AND ELECTRONIC COMPONENT INCLUDING THE SAME

(75) Inventors: Hideki Otsuka, Matue (JP); Kazuhiro Yoshida, Hikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 248 days.

(21) Appl. No.: 12/617,823

(22) Filed: Nov. 13, 2009

(65) Prior Publication Data

US 2010/0123995 A1   May 20, 2010

(30) Foreign Application Priority Data

Nov. 17, 2008   (JP) .................................. 2008-293379

(51) Int. Cl.
H01G 4/228 (2006.01)
H01G 4/06 (2006.01)
(52) U.S. Cl. ...................... 361/306.3; 361/309; 361/311
(58) Field of Classification Search .................. 361/303, 361/311, 306.1, 306.3, 309
See application file for complete search history.

(56) References Cited

U.S. PATENT DOCUMENTS

| 6,191,933 | B1 | 2/2001 | Ishigaki et al. | |
|---|---|---|---|---|
| 6,288,887 | B1 | 9/2001 | Yoshida et al. | |
| 2003/0011959 | A1* | 1/2003 | Moriwaki et al. | 361/308.1 |
| 2004/0183147 | A1 | 9/2004 | Togashi et al. | |

FOREIGN PATENT DOCUMENTS

| JP | 61-24921 U | 2/1986 |
|---|---|---|
| JP | 62-40818 U | 3/1987 |
| JP | 62-135426 U | 8/1987 |
| JP | 04-188810 A | 7/1992 |
| JP | 10-241989 A | 9/1998 |
| JP | 10-275739 A | 10/1998 |
| JP | 11-045821 A | 2/1999 |
| JP | 11-162780 A | 6/1999 |
| JP | 11-219847 A | 8/1999 |
| JP | 2000-223358 A | 8/2000 |
| JP | 2000-235931 A | 8/2000 |
| JP | 2000-235932 A | 8/2000 |
| JP | 2004-172562 A | 6/2004 |
| JP | 2004-288847 A | 10/2004 |
| JP | 2008-130954 A | 6/2008 |

OTHER PUBLICATIONS

Official Communication issued in corresponding Japanese Patent Application No. 2008-293379, mailed on Apr. 26, 2011.
Official Communication issued in corresponding Japanese Patent Application No. 2008-293379, mailed on Feb. 14, 2012.

* cited by examiner

*Primary Examiner* — Eric Thomas
(74) *Attorney, Agent, or Firm* — Keating & Bennett, LLP

(57) ABSTRACT

In a ceramic capacitor, first and second electrode terminals each include a bonded-to-substrate portion, a first bonded-to-electrode portion bonded to a first edge of one of first and second external electrodes, a second bonded-to-electrode portion bonded to a second edge of the one of first and second external electrodes and disposed at a distance from the first bonded-to-electrode portion in the first directions, and a connecting portion connecting the first and second bonded-to-electrode portions and the bonded-to-substrate portion. $W_1/W_0$ is about 0.3 or more, and h/L is about 0.1 or more.

9 Claims, 18 Drawing Sheets

CERAMIC CAPACITOR AND ELECTRONIC COMPONENT INCLUDING THE SAME

BACKGROUND OF THE INVENTION

1. Field of the Invention

The present invention relates to a ceramic capacitor and, in particular, to a ceramic capacitor mounted on a substrate with a pair of external electrodes therebetween, and an electronic component including the ceramic capacitor.

2. Description of the Related Art

In recent years, with increases in performance of mobile electronic apparatuses, such as cell phones and notebook personal computers, the performance of a CPU or the like mounted on such a mobile electronic apparatus has been increased. This has made it difficult to reduce power consumption. On the other hand, mobile electronic apparatuses have been strongly required to be driven by a battery for a longer time.

Accordingly, mobile electronic apparatuses have been strongly required to increase the conversion efficiency of the power supply unit thereof. As the power supply units of mobile electronic apparatuses, DC-DC converters having good conversion efficiency have been widely used. A DC-DC converter circuit uses capacitors at an input portion and an output portion thereof. The capacitor used at the input portion is intended to accumulate electric charge. Therefore, it is desirable that the capacitor at the input portion have a low equivalent series resistance (ESR) and a high capacitance. Also, the DC-DC converter unavoidably produces a ripple voltage on the operating principles thereof. The ripple voltage depends on the impedance of the capacitor at the output portion. In order to restrain the above-mentioned ripple voltage, it is desirable that the capacitor disposed at the output have a low equivalent series inductance (ESL) and a low ESR.

In recent years, with further downsizing of mobile electronic apparatuses, the power supply units thereof have been strongly required to be downsized as well. Accordingly, DC-DC converters often used as power supply units, and capacitors for use in DC-DC converters have been strongly required to be downsized as well. For this reason, ceramic capacitors have been widely used as capacitors that can realize a large capacitance, a low ESR, and a low ESL as well as can be downsized.

Incidentally, in a DC-DC converter, a direct-current voltage on which a ripple voltage, which is an alternating-current component, is superimposed is applied to a capacitor. For this reason, in a DC-DC converter using a multilayer ceramic capacitor, the multilayer ceramic capacitor produces vibration due to an electrostriction effect. When the multilayer ceramic capacitor produces vibration, the vibration propagates to a mount substrate on which the multilayer ceramic capacitor is mounted. As a result, the mount substrate produces vibration. When the vibration frequency of the mount substrate extends to an audible frequency range, the mount substrate emits audible sound. That is, a phenomenon called "substrate noise" occurs.

In order to restrain the above-mentioned substrate noise, various attempts have been made. For example, Japanese Unexamined Patent Application Publication No. 2004-288847 discloses a capacitor 100 shown in FIG. 18. As shown in FIG. 18, the capacitor 100 includes a capacitor body 101 in which multiple internal electrodes (not shown) are formed. A first terminal electrode 102 and a second terminal electrode 103 are formed on the end surfaces of the capacitor body 101. The capacitor 100 is mounted on a substrate 106 with a metal terminal 104 bonded to the first terminal electrode 102 and a metal terminal 105 bonded to the second terminal electrode 103 interposed between the capacitor 100 and substrate 106. In the capacitor 100, the width of an inner connecting portion 102a bonded to the first terminal electrode 102, of the metal terminal 104 and the width of an inner connecting portion 103a bonded to the second terminal electrode 103, of the metal terminal 105 are smaller than the width of the terminal electrode 102 and that of the second terminal electrode 103, respectively. According to Japanese Unexamined Patent Application Publication No. 2004-288847, the above-mentioned configuration can enhance the spring properties of the inner connecting portions 102a and 103a and thus restrain propagation of vibration from the capacitor 100 to the substrate 106, thereby restraining substrate noise.

However, when the inventors of the present application conducted specific research on this device, it turned out that the capacitor 100 could not sufficiently restrain propagation of vibration thereof to the substrate and therefore could not sufficiently restrain substrate noise.

SUMMARY OF THE INVENTION

In view of the above, preferred embodiment of the present invention provide a capacitor that is mounted on a substrate and is arranged to prevent substrate noise much more effectively and satisfactorily.

A ceramic capacitor according to a preferred embodiment of the present invention is a ceramic capacitor mounted on a substrate and includes a capacitor body preferably having a rough rectangular parallelepiped shape, first and second internal electrodes, first and second external electrodes, and first and second electrode terminals. The capacitor body is substantially made of a dielectric material. The capacitor body has first and second end surfaces, first and second side surfaces, and first and second main surfaces. The first and second end surfaces extend along the vertical directions and first directions perpendicular or substantially perpendicular to the vertical directions. The first and second side surfaces extend along second directions perpendicular or substantially perpendicular to the first directions and vertical directions, and the vertical directions. The first and second main surfaces extend along the first directions and second directions. The first and second internal electrodes are disposed at an interval inside the capacitor body. The first external electrode is disposed on the first end surface of the capacitor body. The first external electrode is electrically connected to the first internal electrode. The second external electrode is disposed on the second end surface of the capacitor body. The second external electrode is electrically connected to the second internal electrode. A first edge of the first electrode terminal is bonded to the first external electrode and is electrically connected to the first external electrode. A second edge of the first electrode terminal is bonded to the substrate. A first edge of the second electrode terminal is bonded to the second external electrode and is electrically connected to the second external electrode. A second edge of the second electrode terminal is bonded to the substrate. The capacitor body is supported by the first and second electrode terminals at a distance from the substrate. The first and second electrode terminals each include a bonded-to-substrate portion, first and second bonded-to-electrode portions, and a connecting portion. The bonded-to-substrate portion is bonded to the substrate. The first bonded-to-electrode portion is bonded to an edge in one of the first directions, of one of the first and second external electrodes. The second bonded-to-electrode portion is bonded to an edge in the other of the first directions, of the one of the first and second external electrodes. The second bonded-to-electrode portion is disposed at a distance from the first bonded-to-electrode portion in the first directions. The connecting portion connects the first and second bonded-to-electrode portions and the bonded-to-substrate portion. If a width along the first directions, of a portion of the ceramic capacitor except for the first and second electrode terminals is represented by $W_0$ and a distance along the first directions between the first and second bonded-to-electrode portions is represented by $W_1$, a ratio of the $W_1$ to the $W_0$ preferably is about 0.3 or more. If a length along the second directions, of a portion of the ceramic capacitor except for the first and second electrode terminals is represented by L and a distance along the vertical directions between the capacitor body and the substrate is represented by h, a ratio of the h to the L preferably is about 0.1 or more.

In the ceramic capacitor according to a preferred embodiment of the present invention, the ratio of the $W_1$ to the $W_0$ is preferably about 0.5 or less. By adopting this configuration, substrate noise is prevented effectively while the bonding strength between the first external electrode and first electrode terminal and that between the second external electrode and second electrode terminal are kept at a high level.

In the ceramic capacitor according to a preferred embodiment of the present invention, the ratio of the h to the L is preferably about 0.35 or less. By adopting this configuration, the height dimension of the ceramic capacitor is reduced.

In the ceramic capacitor according to a preferred embodiment of the present invention, the first and second internal electrodes are preferably opposed to each other in the vertical directions.

In the ceramic capacitor according to a preferred embodiment of the present invention, the first and second bonded-to-electrode portions are preferably each bonded to an upper portion and a lower portion of one of the first and second external electrodes rather than to a central portion in the vertical directions, of the one of the first and second external electrodes. By adopting this configuration, substrate noise is prevented much more effectively and satisfactorily.

In the ceramic capacitor according to a preferred embodiment of the present invention, a protrusion protruding toward one of the first and second external electrodes is preferably disposed on portions of the first and second bonded-to-electrode portions, the portions being each bonded to the one of the first and second external electrodes. By adopting this configuration, substrate noise is prevented much more effectively and satisfactorily.

In the ceramic capacitor according to a preferred embodiment of the present invention, a bend that is bent so as to protrude toward one or the other of the second directions is preferably provided in the connecting portion. By adopting this configuration, substrate noise is prevented much more effectively and satisfactorily.

In the ceramic capacitor according to a preferred embodiment of the present invention, none of the first and second bonded-to-electrode portions is preferably bonded to a central portion along the first directions, of one of the first and second external electrodes. The smaller of a distance between a center in the first directions, of one of the first and second external electrodes and an edge in one of the first directions, of the one of the first and second external electrodes and a distance between the center and an edge in the other of the first directions, of the one of the first and second external electrodes is preferably about 0.15 times or more the $W_0$.

An electronic component according to another preferred embodiment of the present invention includes the ceramic capacitor according to one of the above-mentioned preferred embodiments of the present invention.

In the ceramic capacitor according to a preferred embodiment of the present invention, the ratio of the distance $W_1$ along the first directions between the first and second bonded-to-electrode portions to the width $W_0$ along the first directions, of the portion of the ceramic capacitor except for the first and second electrode terminals preferably is about 0.3 or more, and the ratio of the distance h along the vertical directions between the capacitor body and the substrate to the length L along the second directions, of the portion of the ceramic capacitor except for the first and second electrode terminals preferably is about 0.1 or more. Therefore, by using the ceramic capacitor according to one of the various preferred embodiments of the present invention, substrate noise is prevented much more effectively and satisfactorily.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Now, the present invention will be clarified by describing specific preferred embodiments of the present invention with reference to the accompanying drawings.

First Preferred Embodiment

Figure 1:
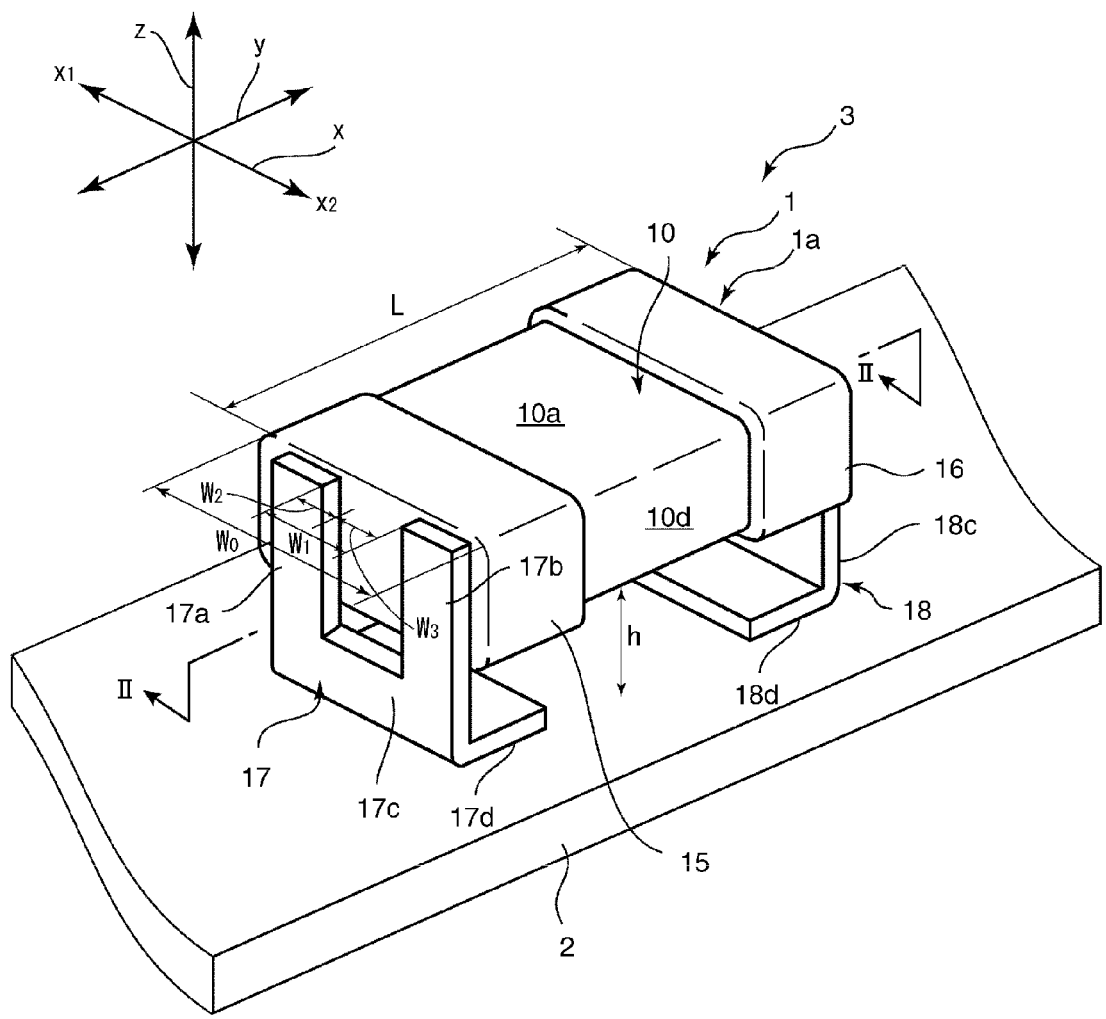
FIG. 1 is a perspective view of an electronic component according to a first preferred embodiment of the present invention.
Figure 2:
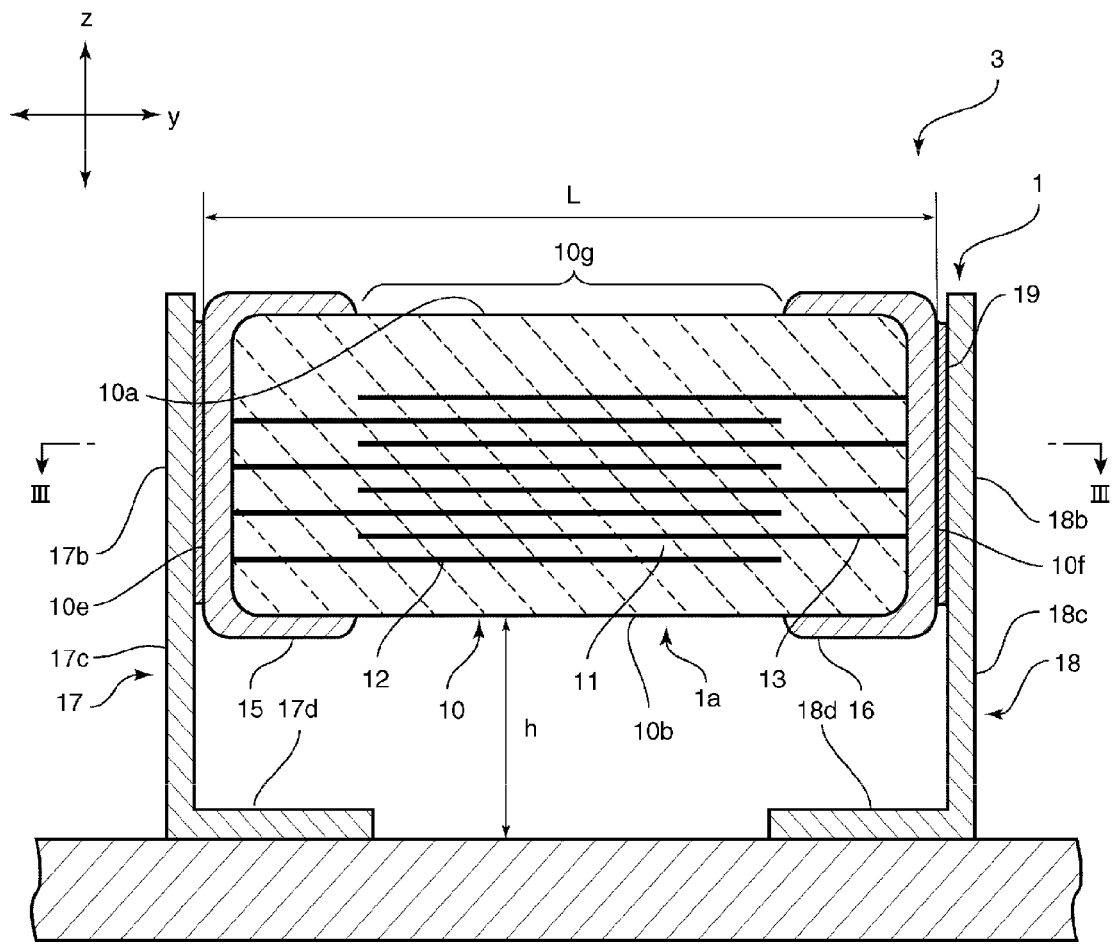
FIG. 2 is a drawing as seen in the direction of arrows II-II of FIG. 1.
Figure 3:
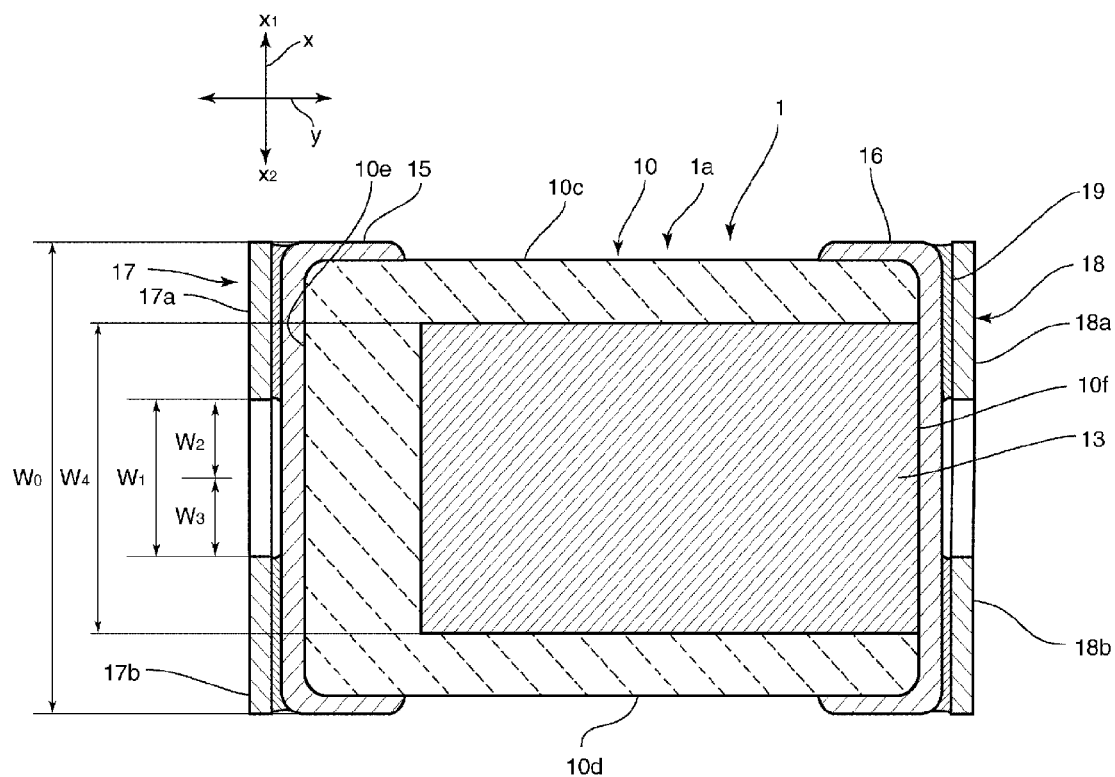
FIG. 3 is a drawing as seen in the direction of arrows III-III of FIG. 2.

FIG. 1 is a perspective view of an electronic component 3 according to a first preferred embodiment of the present invention. FIG. 2 is a schematic sectional view cut along line II-II of FIG. 1. FIG. 3 is a schematic sectional view cut along line III-III of FIG. 2.

As shown in FIG. 1, the electronic component 3 includes a substrate 2 and a ceramic capacitor 1 mounted on the substrate 2. The substrate 2 is a substrate having an electronic circuit, to which the ceramic capacitor 1 is electrically connected, disposed on a surface thereof or therein. The substrate 2 is not limited to a particular type of substrate. For example, the substrate 2 does not necessarily need to be flexible or may be a flexible sheet. For example, the substrate 2 may be a flexible printed circuit (FPC) having an electronic circuit printed thereon.

As shown in FIGS. 1 to 3, the electronic component 1 includes a capacitor body 10 that is substantially made of a dielectric material. As shown in FIG. 2, the capacitor body 10 preferably is a dielectric layer lamination body formed by laminating multiple dielectric layers 11.

In this preferred embodiment, the dielectric layers 11 are made of appropriate dielectric ceramic. Among specific examples of such dielectric ceramic are $BaTiO_3$, $CaTiO_3$, $SrTiO_3$, and $CaZrO_3$. The dielectric ceramic may be dielectric ceramic mainly containing $BaTiO_3$, $CaTiO_3$, $SrTiO_3$, $CaZrO_3$, or other suitable material and additionally containing a Mn compound, a Fe compound, a Cr compound, a Co compound, a Ni compound or other suitable material, for example.

As shown in FIGS. 1 to 3, the capacitor body 10 is preferably formed in the shape of a rough rectangular parallelepiped, for example, having a first main surface 10a (upper surface) and a second main surface (lower surface) 10b that are opposed to each other, a first side surface 10c and a second side surface 10d that are opposed to each other, and a first end surface 10e and a second end surface 10f that are opposed to each other. The first end surface 10e and second end surface 10f extend along vertical directions z and first directions x perpendicular or substantially perpendicular to the vertical directions z.

The first end surface 10e and second end surface 10f are disposed along second directions y perpendicular or substantially perpendicular to both the vertical directions z and first directions x.

The first side surface 10c and second side surface 10d extend along the vertical directions z and second directions y. The first side surface 10c and second side surface 10d are disposed along the first directions x. The first main surface 10a and second main surface 10b extend along the first directions x and second directions y. The first main surface 10a and second main surface 10b are disposed along the vertical directions z.

As shown in FIG. 2, in the capacitor body 10, multiple first internal electrodes 12 and multiple second internal electrodes 13 are disposed alternately along the vertical directions z at intervals. Each first internal electrode 12 and an adjacent second internal electrode 13 are opposed to each other with a dielectric layer 11 therebetween in the vertical directions z. Thus, the multiple first internal electrodes 12 and multiple second internal electrodes 13 are insulated from each other.

The materials of the first internal electrodes 12 and second internal electrodes 13 are not limited to particular ones. Among examples of the materials of the first internal electrodes 12 and second internal electrodes 13 are metals, such as Ni, Cu, Ag, Pd, and Au, and alloys including at least one of these metals, such as an Ag—Pd alloy. The first internal electrodes 12 and second internal electrodes 13 are preferably made of an identical metal or alloy.

The thicknesses of the first internal electrodes 12 and second internal electrodes 13 are not limited to particular ones and may be, for example, about 0.3 μm to about 2 μm or so.

As shown in FIG. 2, ends of the multiple first internal electrodes 12 are drawn onto the first end surface 10e. The multiple first internal electrodes 12 are disposed at equal intervals in the vertical directions z of the ceramic capacitor 1 as extending in a direction parallel or substantially parallel with the first main surface 10a and second main surface 10b. The first internal electrodes 12 do not extend to any portion of the first side surface 10c and second side surface 10d.

As shown in FIGS. 2 and 3, ends of the multiple second internal electrodes 13 are drawn onto the second end surface 10f. The multiple second internal electrodes 13 are disposed at equal intervals in the vertical directions z of the ceramic capacitor 1 as extending in a direction parallel or substantially parallel with the first main surface 10a and second main surface 10b. As shown in FIG. 3, the second internal electrodes 13 do not extend to any portion of the first side surface 10c and second side surface 10d.

As shown in FIG. 2, a rough central portion of the capacitor body 10 where the multiple first internal electrodes 12 and multiple second internal electrodes 13 are disposed in the vertical directions z constitutes a capacitor section 10g. A capacitance is formed in the capacitor section 10g.

The width $W_4$ along the first directions x, of the first internal electrodes 12 or second internal electrodes 13 shown in FIG. 3 is not limited to a particular size. If the first internal electrodes 12 and second internal electrodes 13 are disposed in the center of the capacitor body 10, the width $W_4$ may be set to, for example, about 0.3 to about 0.9 times the width $W_0$ of a capacitor major portion 1a.

As shown in FIG. 2, a first external electrode 15 is formed on the first end surface 10e. As shown in FIG. 1, edges of the first external electrode 15 extend onto even the first main surface 10a and second main surface 10b and the first side surface 10c and second side surface 10d. As shown in FIG. 2, the first external electrode 15 is electrically connected to the multiple first internal electrodes 12.

A second external electrode 16 is disposed on the second end surface 10f. As shown in FIG. 1, edges of the second external electrode 16 extend onto even the first main surface 10a and second main surface 10b and the first side surface 10c and second side surface 10d. As shown in FIG. 2, the second external electrode 16 is electrically connected to the multiple second internal electrodes 13.

The materials of the first external electrode 15 and second external electrode 16 are not limited to particular ones. Among examples of the materials of the first external electrode 15 and second external electrode 16 are metals, such as Cu, Ni, Ag, Pd, and Au, and alloys including one or more of these metals, such as an Ag—Pd alloy.

In order to prevent denaturation or the like of the first external electrode 15 and second external electrode 16, for example, one or more plated films, such as a Ni-plated film or a Sn-plated film, are preferably formed on each of the first and second external electrodes. For example, a multilayer body made up of a Ni-plated film and a Sn-plated film may be formed on a surface of each of the first external electrode 15 and second external electrode 16.

As shown in FIGS. 1 and 2, the capacitor body 10 is supported above the substrate 2 by a first electrode terminal 17 and a second electrode terminal 18, which are both made of a metal. The first electrode terminal 17 and second electrode terminal 18 are substantially made of a conductive material. For example, the first external electrode 17 and second external electrode 18 may be made of a metal, such as Cu, Ni, Ag, Pd, or Au, or an alloy including one or more of these metals, such as an Ag—Pd alloy or a Fe alloy.

In order to prevent denaturation or the like of the first electrode terminal 17 and second electrode terminal 18, for example, one or more plated films, such as a Ni-plated film or a Sn-plated film, are preferably formed on a surface of each of the first and second electrode terminals. For example, a multilayer body made up of a Ni-plated film and a Sn-plated film may be formed on a surface of each of the first electrode terminal 17 and second electrode terminal 18.

A first edge of the first electrode terminal 17 is bonded to the first external electrode 15, and a second edge thereof is bonded to the substrate 2. Specifically, as shown in FIG. 2, the first electrode terminal 17 includes a first bonded-to-electrode portion 17a, a second bonded-to-electrode portion 17b, a connecting portion 17c, and a bonded-to-substrate portion 17d.

On the other hand, a first edge of the second electrode terminal 18 is bonded to the second external electrode 16, and a second edge thereof is bonded to the substrate 2. Specifically, the second electrode terminal 18 includes a first bonded-to-electrode portion 18a, a second bonded-to-electrode portion 18b, a connecting portion 18c, and a bonded-to-substrate portion 18d.

In this preferred embodiment, the first bonded-to-electrode portion 17a, second bonded-to-electrode portion 17b, connecting portion 17c, and bonded-to-substrate portion 17d are preferably formed integrally using one metal plate. Likewise, the first bonded-to-electrode portion 18a, second bonded-to-electrode portion 18b, connecting portion 18c, and bonded-to-substrate portion 18d are preferably formed integrally using one metal plate. However, the present invention is not limited to this configuration. For example, with regard to the first electrode terminal 17, at least one of the first bonded-to-electrode portion 17a, second bonded-to-electrode portion 17b, connecting portion 17c, and bonded-to-substrate portion 17d may be formed separately. The same goes for the second electrode terminal 18.

The bonded-to-substrate portions 17d and 18d are preferably bent by about 90° relative to the connecting portions 17c and 18c, respectively. The bonded-to-substrate portions 17d and 18d are bonded to the substrate 2. More specifically, the entire surfaces facing the substrate 2, of the bonded-to-substrate portions 17d and 18d are bonded to the substrate 2.

A method for bonding the bonded-to-substrate portions 17d and 18d to the substrate 2 is not limited to a particular one. For example, the bonded-to-substrate portions 17d and 18d may be bonded to the substrate 2 using an appropriate bonding member, such as high-temperature solder, e.g., Sn—Sb high-temperature solder, Sb—Pb eutectic solder, Sn—Ag—Cu lead-free solder, Sn—Cu Pb-free solder, a conductive adhesive including conductive fine particles, a bolt, or a rivet.

The bonded-to-substrate portion 17d is connected to the first electrode-side bonding portion 17a and second electrode-side bonding portion 17b via the connecting portion 17c. The bonded-to-substrate portion 18d is connected to the first electrode-side bonding portion 18a and second electrode-side bonding portion 18b via the connecting portion 18c. None of the connecting portions 17c and 18c is directly connected to the capacitor major portion 1a.

The first bonded-to-electrode portion 17a and second bonded-to-electrode portion 17b extend from the connecting portion 17c in a direction opposite to a direction toward the substrate 2. Likewise, the first electrode-side bonding portion 18a and second bonded-to-electrode portion 18b extend from the connecting portion 18c in a direction opposite to a direction toward the substrate 2. As shown in FIG. 3, the sum of the widths along the first directions x, of the first bonded-to-electrode portion 17a and second bonded-to-electrode portion 17b is smaller than the width along the first directions x, of the first external electrode 15. Likewise, the sum of the widths along the first directions x, of the first bonded-to-electrode portion 18a and second bonded-to-electrode portion 18b is smaller than the width along the first directions x, of the second external electrode 16.

The first bonded-to-electrode portion 17a and second electrode-side bonding portion 17b are disposed at a distance from each other along the first directions x. The same goes for the first electrode-side bonding portion 18a and second electrode-side bonding portion 18b. The first bonded-to-electrode portion 17a is bonded to an edge in a first direction $x_1$ of the first directions x, of the first external electrode 15. Likewise, the first bonded-to-electrode portion 18a is bonded to an edge in the first direction $x_1$ of the first directions x, of the second external electrode 16. In this preferred embodiment, the almost entire surface facing the first external electrode 15, of the first bonded-to-electrode portion 17a is bonded to the first external electrode 15. Likewise, the almost entire surface facing the second external electrode 16, of the first bonded-to-electrode portion 18a is bonded to the second external electrode 16. On the other hand, the second bonded-to-electrode portion 17b is bonded to an edge in a second direction $x_2$ of the first directions x, of the first external electrode 15. Likewise, the second bonded-to-electrode portion 18b is bonded to an edge in the second direction $x_2$ of the first directions x, of the second external electrode 16. In this preferred embodiment, almost the entire surface facing the first external electrode 15, of the second electrode-side bonding portion 17b is bonded to the first external electrode 15. Likewise, the almost entire surface facing the second external electrode 16, of the second electrode-side bonding portion 18b is bonded to the second external electrode 16.

None of the first bonded-to-electrode portion 17a and second bonded-to-electrode portion 17b is bonded to the central portion in the first directions x, of the first external electrode 15. Likewise, none of the first bonded-to-electrode portion 18a and second bonded-to-electrode portion 18b is bonded to the central portion in the first directions x, of the second external electrode 16. In other words, the first electrode terminal 17 is bonded to only both edges in the first directions x, of the first external electrode 15, and the second electrode terminal 18 is bonded to only both edges in the first directions x, of the second external electrode 16.

A method for bonding the first bonded-to-electrode portion 17a and second bonded-to-electrode portion 17b to the first external electrode 15 is not limited to a particular one. The same goes for a method for bonding the first bonded-to-electrode portion 18a and second bonded-to-electrode portion 18b to the second external electrode 16. For example, using a bonding member, such as high-temperature solder, e.g., Sn—Sb high-temperature solder, a conductive adhesive including conductive fine particles, a bolt, or a rivet, the first bonded-to-electrode portion 17a and second bonded-to-electrode portion 17b may be bonded to the first external electrode 15, and the first bonded-to-electrode portion 18a and second bonded-to-electrode portion 18b may be bonded to the second external electrode 16. In this preferred embodiment, there will be described an example where, as shown in FIGS. 2 and 3, by using bonding layers 19 made of high-temperature solder, the first bonded-to-electrode portion 17a and second bonded-to-electrode portion 17b are bonded to the first external electrode 15 and the first bonded-to-electrode portion 18a and second bonded-to-electrode portion 18b are bonded to the second external electrode 16.

In this preferred embodiment, as shown in FIG. 3, the width ratio $W_1/W_0$ of the distance $W_1$ along the first directions x between the first bonded-to-electrode portion 17a and second bonded-to-electrode portion 17b (or the first bonded-to-electrode portion 18a and second bonded-to-electrode portion 18b) to the width $W_0$ along the first directions x, of the capacitor major portion 1a of the ceramic capacitor 1 except for the first electrode terminal 17 and second electrode terminal 18 is preferably set to about 0.3 or more, for example. Also, the length ratio L/h of the length h along the vertical directions between the capacitor body 10 and substrate 2 to the length L along the second directions y, of the capacitor major portion 1a is preferably set to about 0.1 or more, for example. Thus, propagation of vibration of the capacitor major portion 1a to the substrate 2 is prevented much more effectively. Therefore, by using the ceramic capacitor 1 according to this preferred embodiment, substrate noise is prevented much more effectively and satisfactorily.

In order to more effectively prevent substrate noise, the width ratio $W_1/W_0$ is preferably about 0.35 or more, and the length ratio L/h is preferably about 0.2 or more, for example.

In order to even more effectively prevent the substrate noise, the ratio of the smaller of the distance $W_2$ along the first directions x between the center along the first directions x, of the first external electrode 15 (or second external electrode 16) and the first bonded-to-electrode portion 17a (or first electrode-side bonding portion 18a) and the distance $W_3$ along the first directions x between the center of the first external electrode 15 (or second external electrode 16) and the second bonded-to-electrode portion 17b (or second electrode-side bonding portion 18b) to the width $W_0$ is preferably about 0.15 or more, more preferably, about 0.175 or more, for example.

In relation to the width $W_4$ along the first directions x, of the first internal electrodes 12 or second internal electrodes 13, the distance $W_1$ is preferably about 0.35 to about 0.9 times the width $W_4$, and the smaller of the distance $W_2$ and distance $W_3$ is preferably about 0.75 to about 0.45 times the width $W_4$, for example.

Also, in this preferred embodiment, the width ratio $W_1/W_0$ is set to about 0.5 or less, for example. Thus, substrate noise is prevented while the bonding strength between the first external electrode 15 and first electrode terminal 17 and that between the second external electrode 16 and second electrode terminal 18 are kept at a high level. In order to further increase the bonding strength between the first external electrode 15 and first electrode terminal 17 and that between the second external electrode 16 and second electrode terminal 18, the width ratio $W_1/W_0$ is preferably about 0.45 or less, for example.

Also, in this preferred embodiment, the length ratio L/h is preferably set to about 0.35 or less, for example. Thus, the height dimension of the ceramic capacitor 1 is reduced while substrate noise is prevented much more effectively and satisfactorily. More preferably, the length ratio L/h preferably is about 0.2 or less, for example. By adopting this configuration, the height dimension of the ceramic capacitor 1 is further reduced while substrate noise is prevented much more effectively and satisfactorily.

The reason why substrate noise is prevented much more effectively and satisfactorily by using the ceramic capacitor 1 where the width ratio $W_1/W_0$ is preferably set to about 0.3 or more is as follows.

Generally, when applying an electric field to a dielectric material, a crystal lattice is distorted due to a dielectric phenomenon. Thus, the dielectric material expands in a direction parallel or substantially parallel with the eclectic field and contracts in a direction perpendicular or substantially perpendicular to the electric field. Also, the capacitor section 10g that has subjected to the application of the electric field significantly expands or contracts, while the portions other than the capacitor section 10g do not expand or contract so much. That is, the portions closer to the edges than the capacitor section 10g, of the capacitor body 10 do not expand or contract so much.

Figure 4:
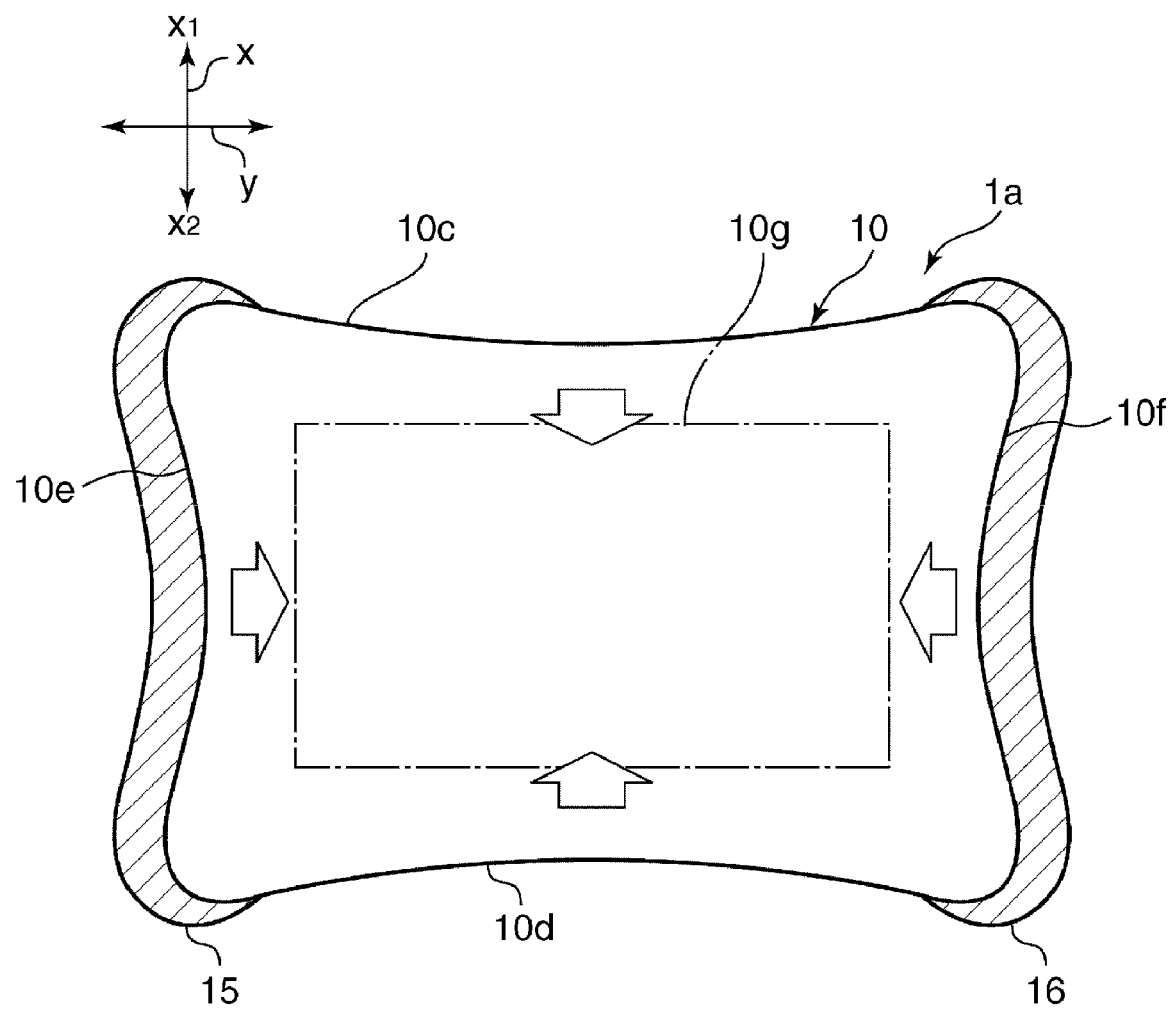
FIG. 4 is schematic sectional view of a capacitor major portion along first and second directions showing a deformed state of the capacitor major portion according to the first preferred embodiment of the present invention.
Figure 5:
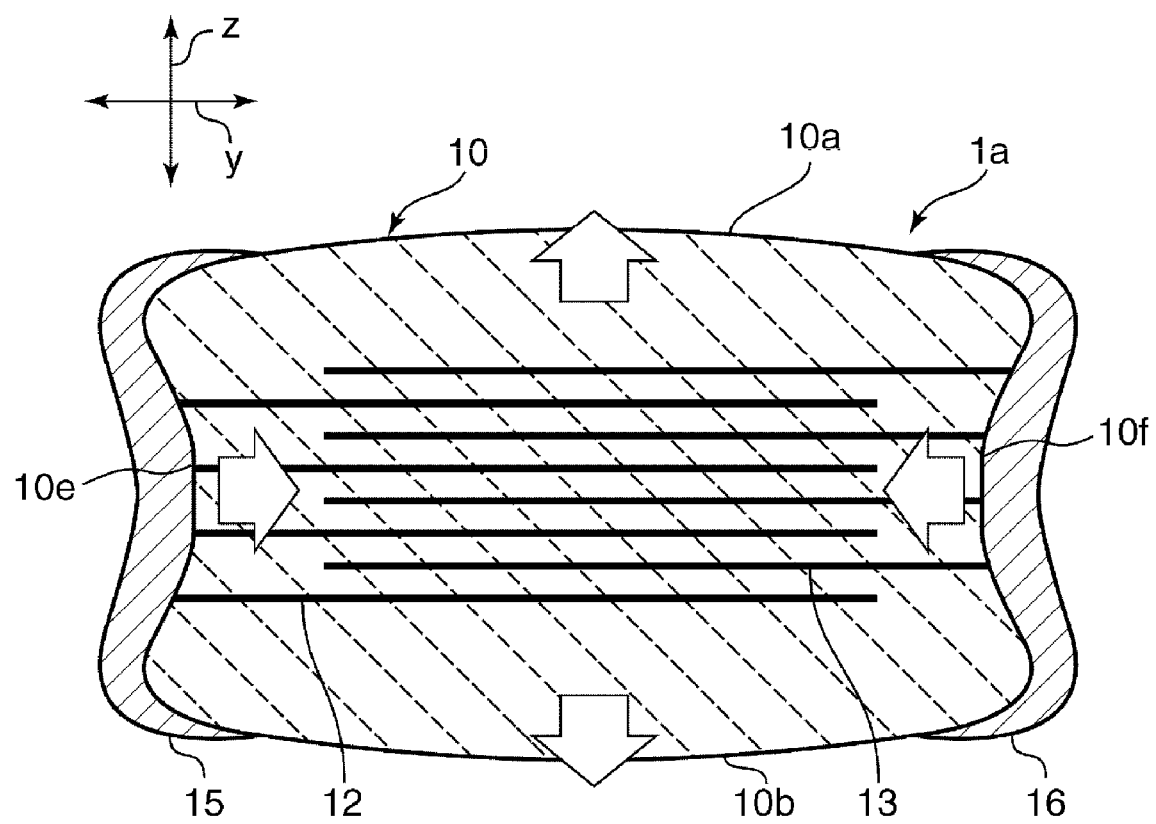
FIG. 5 is schematic sectional view of the capacitor major portion along the vertical directions and second directions showing a deformed state of the capacitor major portion according to the first preferred embodiment of the present invention.
Figure 6:
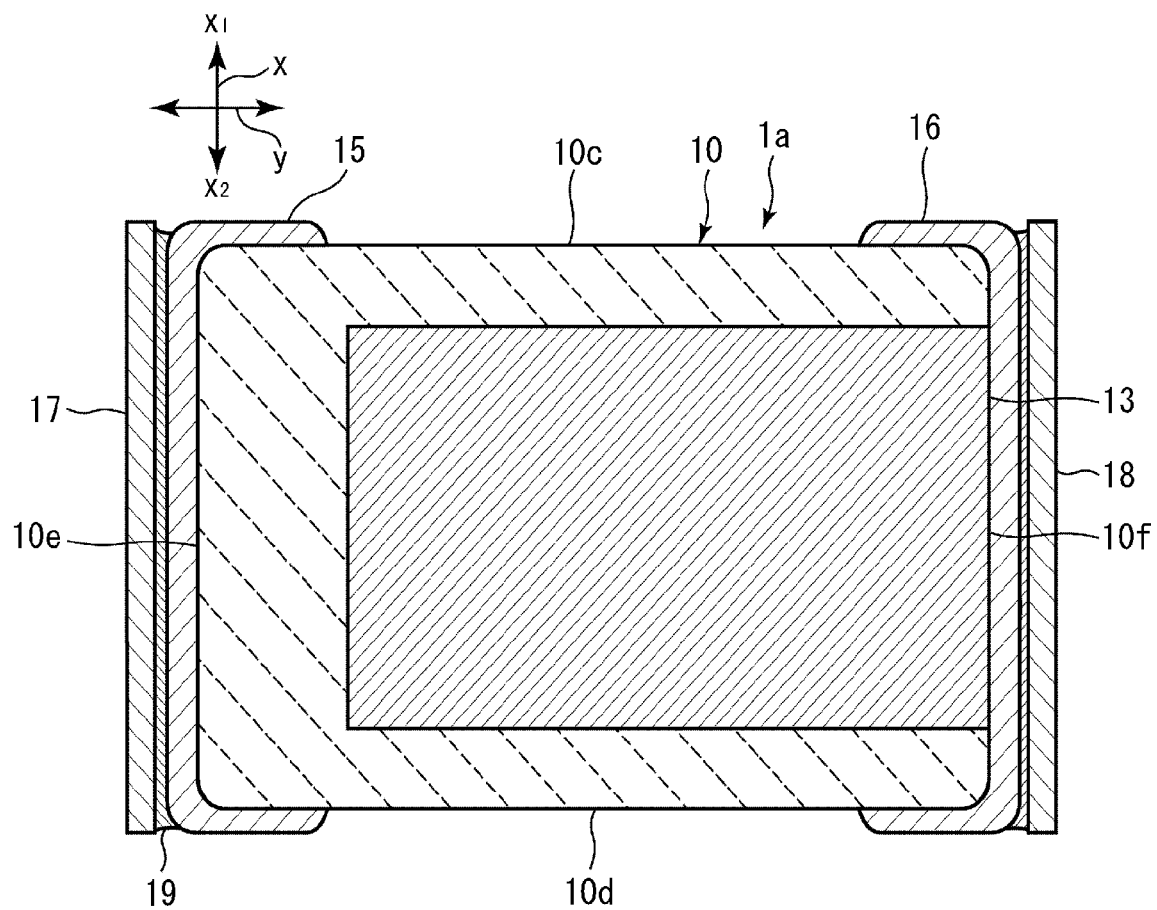
FIG. 6 is a sectional view of a ceramic capacitor where the first and second electrode terminals are bonded to an entire surface of the first electrode terminal or second electrode terminal.

In this preferred embodiment, the first internal electrodes 12 and second internal electrodes 13 are opposed to each other in the vertical directions z. For this reason, the directions of the electric field are the vertical directions z. Therefore, the central portion in the second directions y, of the capacitor major portion 1a significantly expands in the vertical directions z compared with both edges thereof in the second directions y as shown in FIG. 5, while the central portion significantly contracts in the first directions x as shown in FIG. 4. The central portion in the vertical directions z, of the capacitor major portion 1a significantly expands in both the first directions x and second directions y compared with both edges thereof in the vertical directions z.

Figure 7:
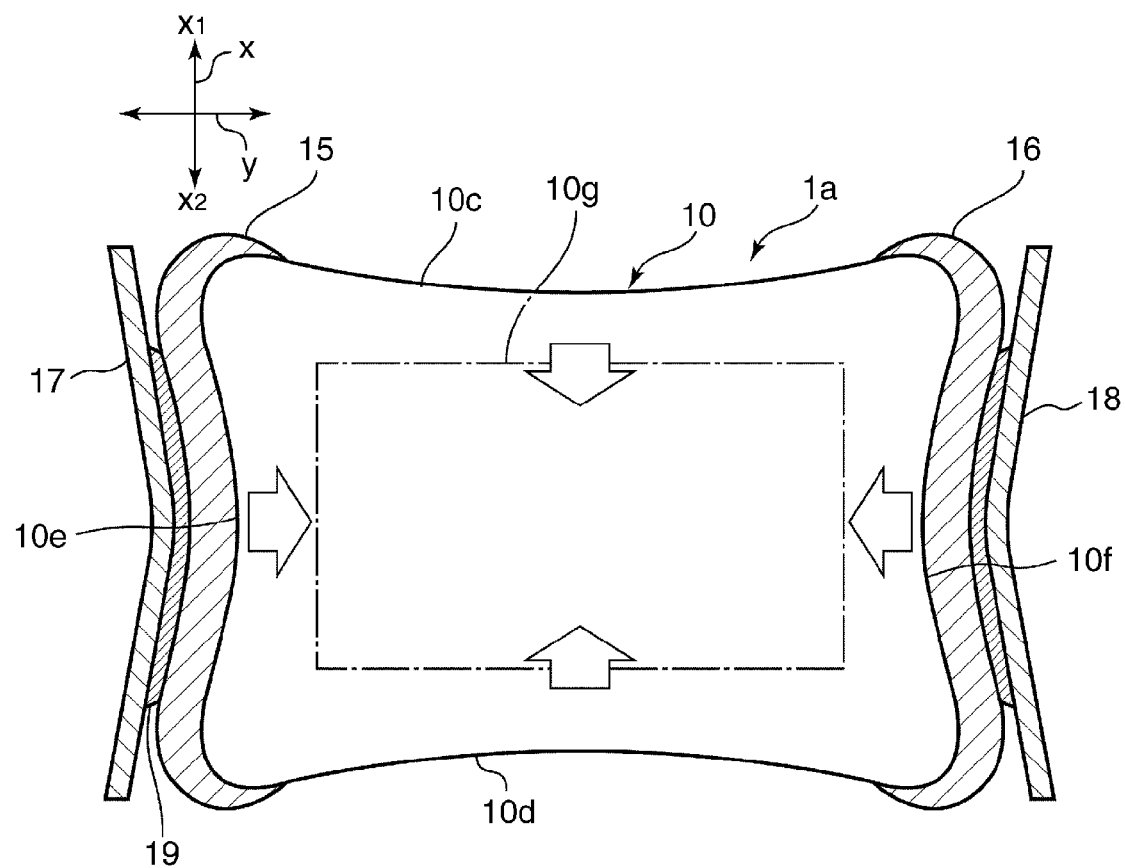
FIG. 7 is a schematic sectional view of a capacitor major portion along the first and second directions showing a deformed state of the capacitor major portion of the ceramic capacitor shown in FIG. 6.

For this reason, in a ceramic capacitor where the first electrode terminal 17 and second electrode terminal 18 are bonded to entire surfaces of the first external electrode 15 and second external electrode 16, the first and second electrode terminals significantly become deformed as the capacitor major portion 1a becomes deformed, as shown in FIG. 7. Therefore, vibration of the capacitor major portion 1a easily propagates to the substrate 2 via the first electrode terminal 17 and second electrode terminal 18. As a result, substrate noise is apt to occur.

Figure 8:
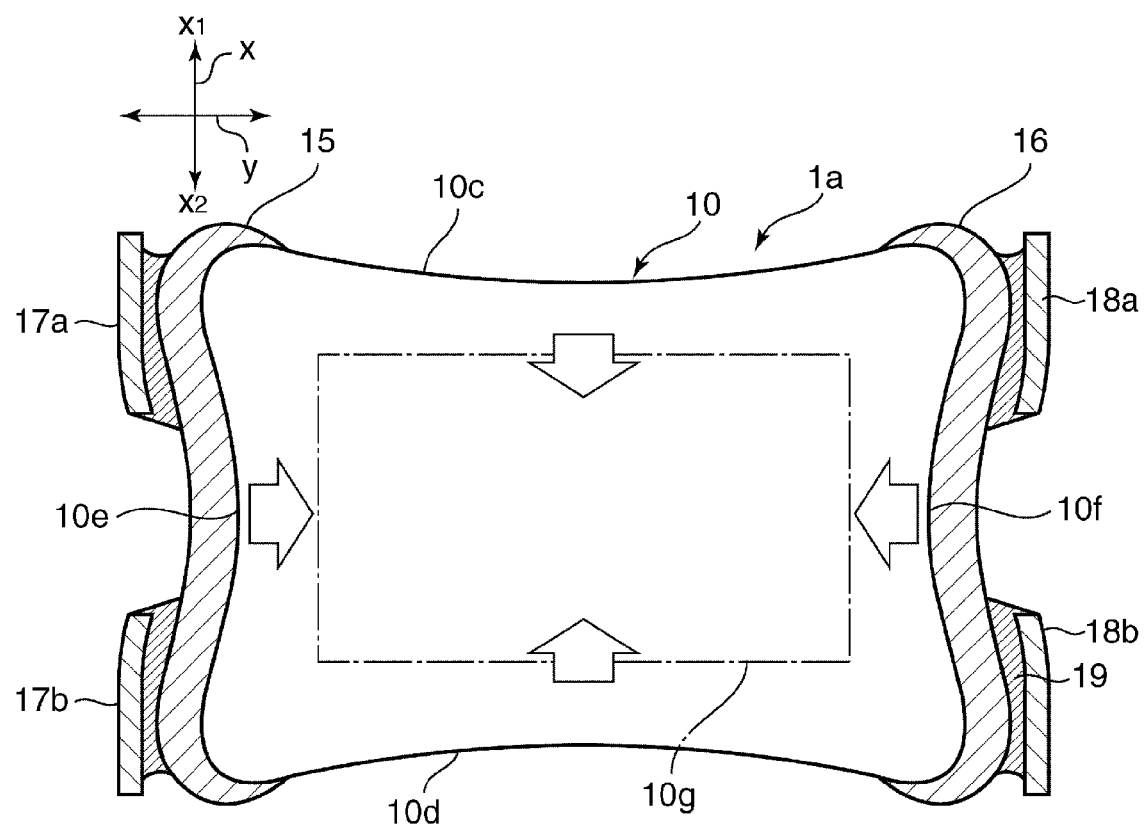
FIG. 8 is schematic sectional view of the capacitor major portion along the first and second directions showing a deformed state of the capacitor major portion according to the first preferred embodiment.

On the other hand, if the first electrode terminal 17 and second electrode terminal 18 are bonded to both edges of the capacitor major portion 1a, which are less likely to become deformed, rather than to the central portion of the capacitor major portion 1a, which can significantly become deformed, as in this preferred embodiment, none of the first electrode terminal 17 and second electrode terminal 18 becomes deformed so much even if the capacitor major portion 1a becomes deformed, as shown in FIG. 8. Thus, vibration of the capacitor major portion 1a no longer easily propagates to the substrate 2 via the first electrode terminal 17 and second electrode terminal 18. As a result, substrate noise due to an electrostriction phenomenon of the ceramic capacitor is prevented much more effectively and satisfactorily.

More specifically, the portion within the range of about 0.15 times the width $W_0$ from the center of the capacitor major portion 1a in the first directions x vibrates much more heavily than the other portions of the capacitor major portion 1a. This point will be supported in an experimental example later. Therefore, if none of the first electrode terminal 17 and second electrode terminal 18 is bonded to the portion within the range of about 0.15 times the width $W_o$ from the center of the capacitor major portion 1a, substrate noise will be prevented much more effectively. In other words, if the ratio of the smaller of the distance $W_2$ and distance $W_3$ to the width $W_o$ is set to about 0.15 or more, for example, substrate noise due to an electrostriction phenomenon of the ceramic capacitor will be prevented much more effectively and satisfactorily.

First Experimental Example

The ceramic capacitor described in the above-mentioned first preferred embodiment was manufactured in a multiple number at various $W_1/W_0$ ratios. Subsequently, each of the manufactured ceramic capacitors was bonded to a substrate that has a thickness of about 1.6 mm, a length of about 40 mm, and a width of about 100 mm and is made of glass epoxy (FR-4), and the sound pressure level of substrate noise made at that time was measured. As for the design parameters other than $W_1/W_0$, same values were set for each ceramic capacitor. For each ceramic capacitor, the width dimension along the first directions x, of the capacitor body was set to about 3.2 mm, the length dimension thereof along the second directions y was set to about 2.5 mm, and the height dimension thereof was set to about 2.0 mm. The first and second external electrodes were formed of Cu, and a Ni-plated layer and a Sn-plated layer were formed on a surface of each external electrode. The first and second electrode terminals were formed of a Fe alloy, and a Ni-plated layer and a Sn-plated layer were formed on a surface of each electrodes terminal. The length L along the second directions y, of the capacitor major portion was set to about 3.2 mm, and the distance h along the vertical directions z between the capacitor body and substrate was set to about 0.6 mm. Using Sn—Sb high temperature solder, the first external electrode and first electrode terminal were bonded together and the second external electrode and second electrode terminal were bonded together.

Figure 9:
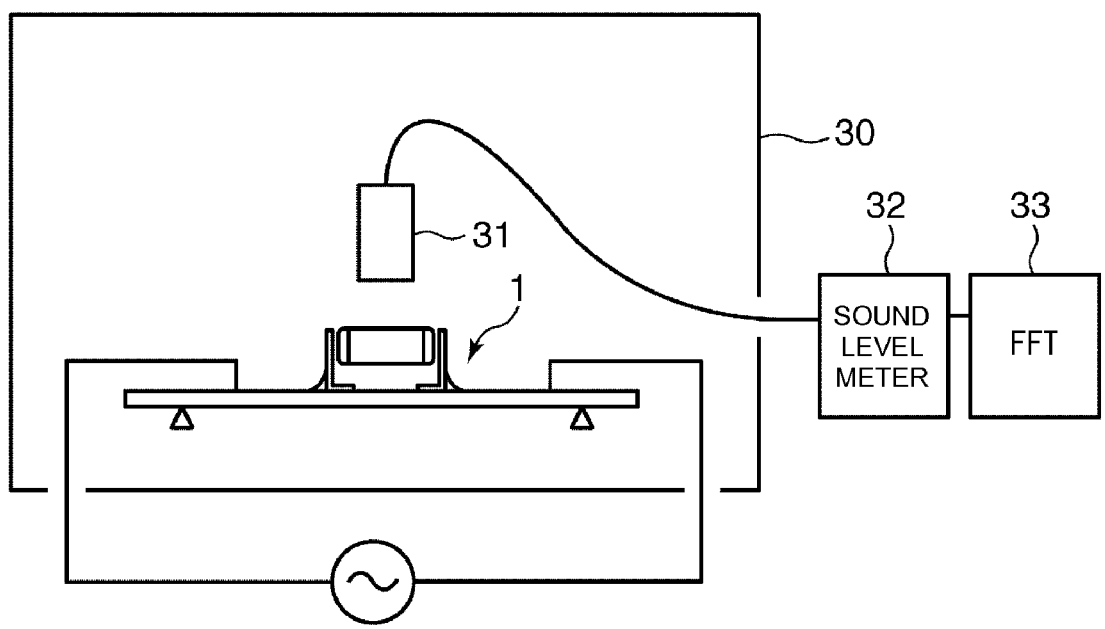
FIG. 9 is a drawing showing a configuration of a measuring instrument for measuring the sound pressure level of substrate noise.

The sound pressure level of substrate noise was measured using an instrument shown in FIG. 9. Specifically, the substrate 2 having the ceramic capacitor 1 mounted thereon was disposed in an anechoic box 30, and an alternating current having a frequency of about 3 kHz and a voltage of about 1 Vpp was applied to the ceramic capacitor. Substrate noise made at that time was collected using a sound collection microphone 31, and the level of the collected sound was measured using a sound level meter 32 and an FFT analyzer 33 (CF-5200 manufactured by ONO SOKKI CO., LTD). The sound collection microphone 31 was disposed 5 mm away from the substrate.

Figure 10:
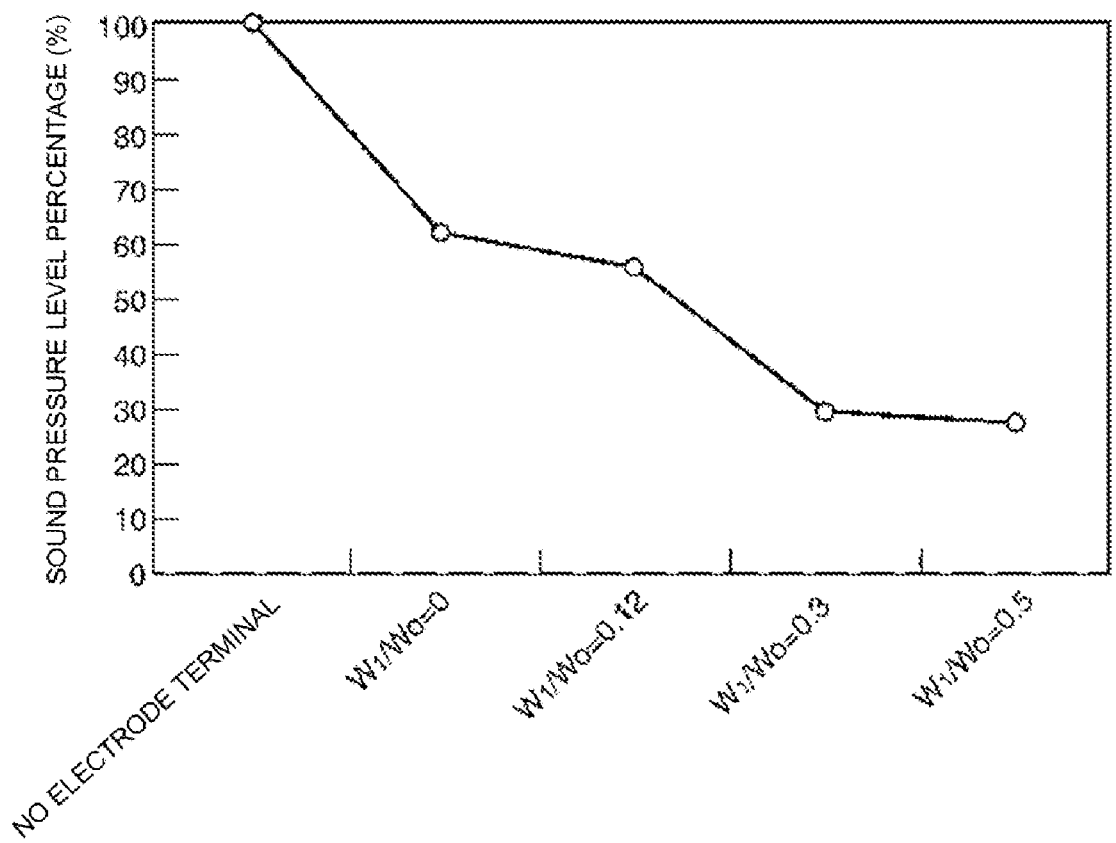
FIG. 10 is a graph showing the relationship between $W_1/W_0$ and the sound pressure level of substrate noise.

FIG. 10 shows the measurement results. From FIG. 10, it is understood that when $W_1/W_0$ was about 0, the sound level of substrate noise was lower than that in a case where none of the first and second electrode terminals was provided but it remained high and that the sound level of substrate noise was reduced as $W_1/W_0$ was increased. Also, it is understood that when $W_1/W_0$ was set to about 0.3 or more, for example, the sound level of substrate noise was sufficiently reduced. Also, it is understood that even when $W_1/W_0$ was further increased, the sound level of substrate noise was not reduced so much. From these results, it is understood that by setting $W_1/W_0$ to about 0.3 or more, substrate noise can be prevented much more effectively and satisfactorily.

Second Experimental Example

Various ceramic capacitors having a configuration similar to that of the first experimental example were manufactured while changing only h/L. Subsequently, as in the above-mentioned first experimental example, the sound level of substrate noise was measured for each ceramic capacitor. In this experimental example, $W_1/W_0$ was fixed to about 0.3.

Figure 11:
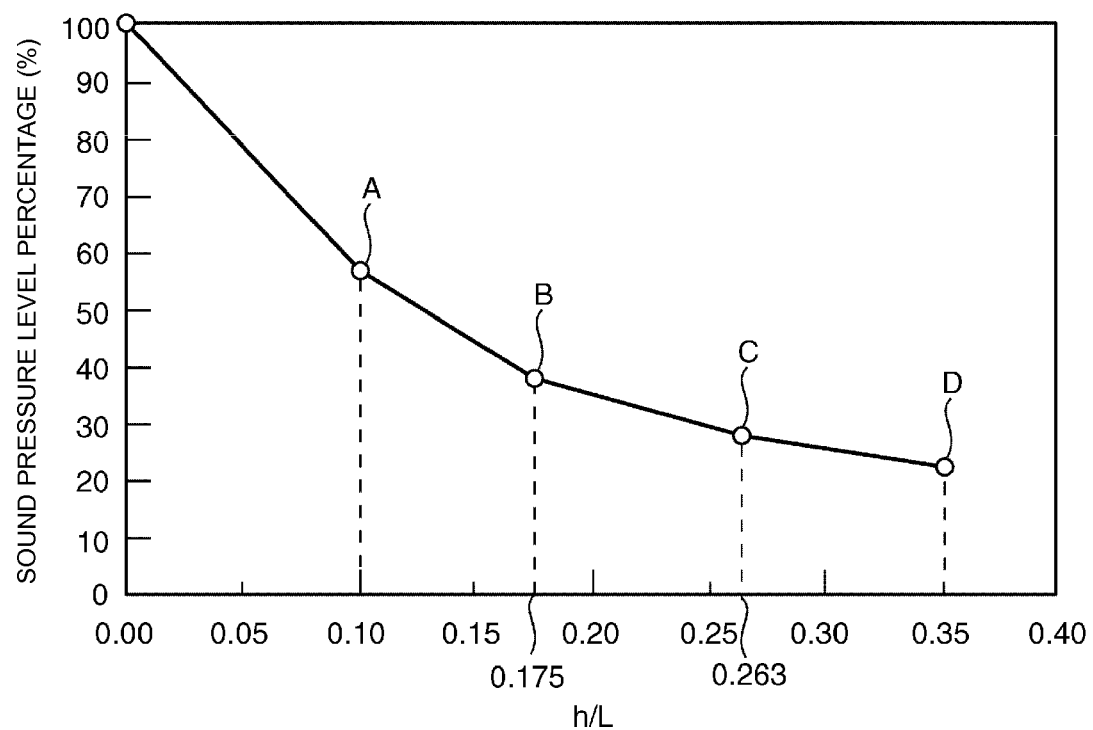
FIG. 11 is a graph showing the relationship between h/L and the sound pressure level of substrate noise.

FIG. 11 shows the measurement results. Note that the values of h/L at points A to D in FIG. 11 were about 0.10, about 0.175, about 0.263, and about 0.35, respectively.

From the results shown in FIG. 11, it is understood that by setting h/L to about 0.1 or more, the sound level of substrate noise can be prevented much more effectively and satisfactorily. Specifically, it is understood that by setting h/L to about 0.1 or more, the sound level of substrate noise can be reduced by about 40% or more compared with that in a case where h/L is about 0.

In the range where h/L exceeds about 0.35, the sound level of substrate noise did not change so much even if h/L was increased.

Hereafter, another preferred embodiment of the present invention will be described. In the following description, members having substantially the same functions as those of the members of the above-mentioned first preferred embodiment are assigned same reference numerals and will not be described.

Second Preferred Embodiment

Figure 12:
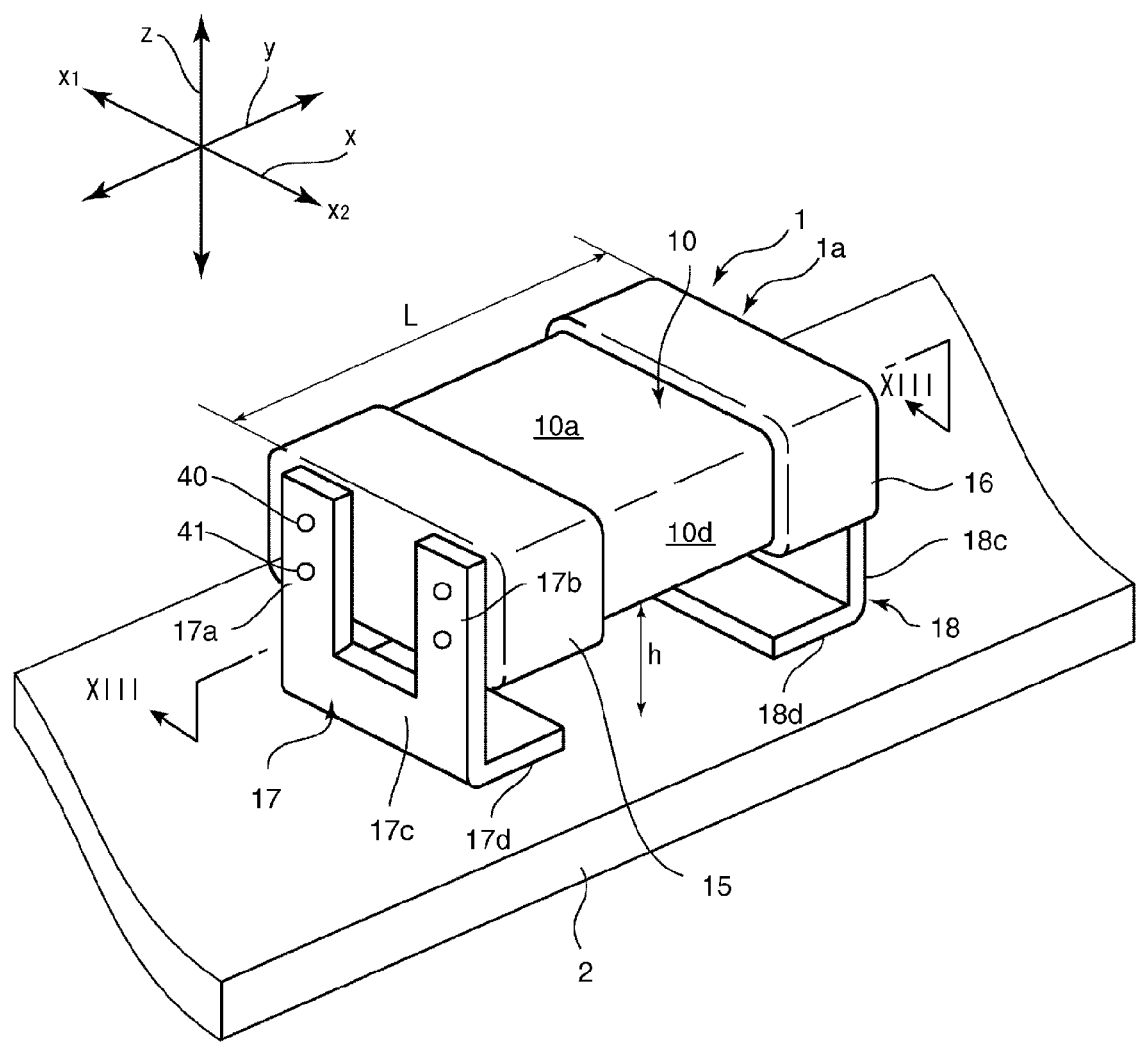
FIG. 12 is a schematic perspective view of an electronic component according to a second preferred embodiment of the present invention.
Figure 13:
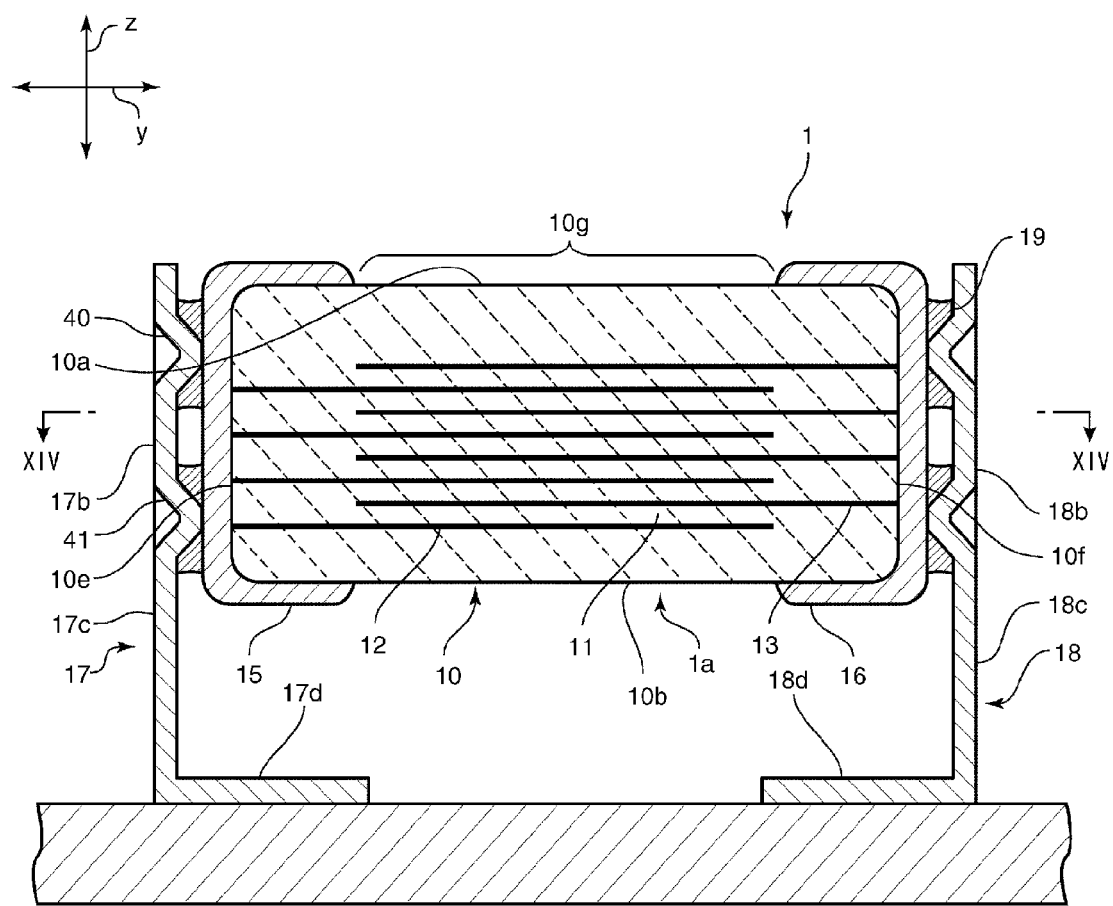
FIG. 13 is a drawing as seen in the direction of arrows XIII-XIII of FIG. 12.
Figure 14:
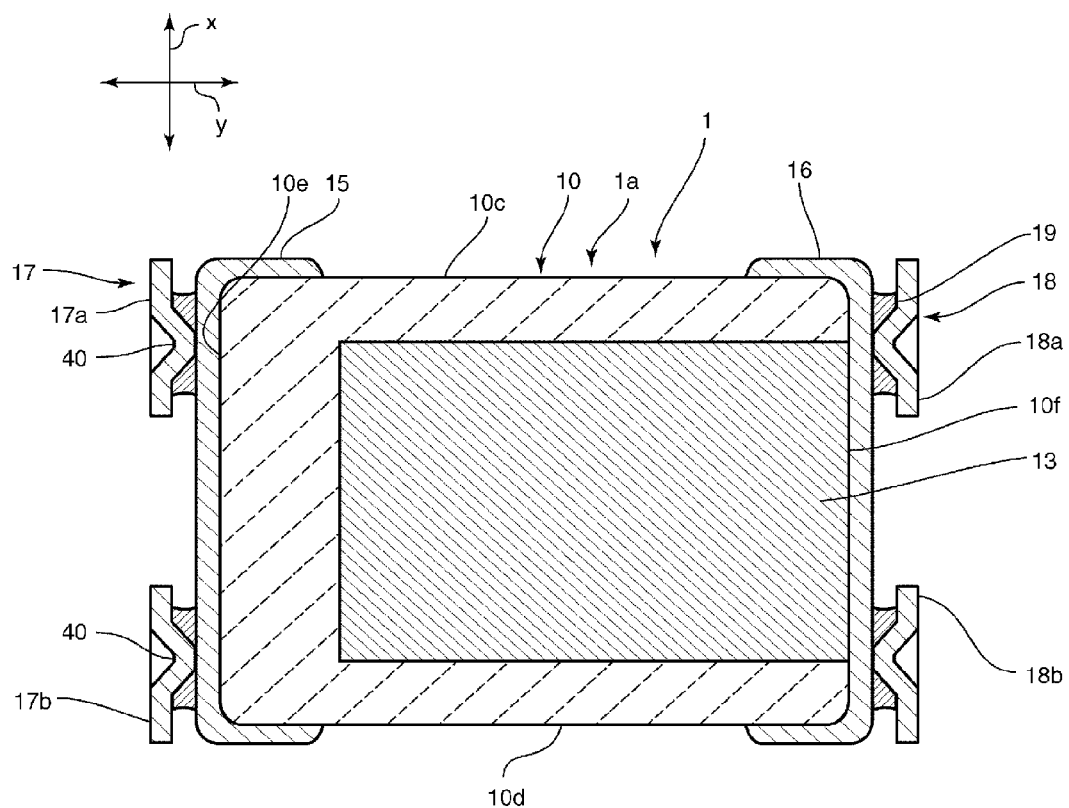
FIG. 14 is a drawing as seen in the direction of arrows XIV-XIV of FIG. 13.
Figure 15:
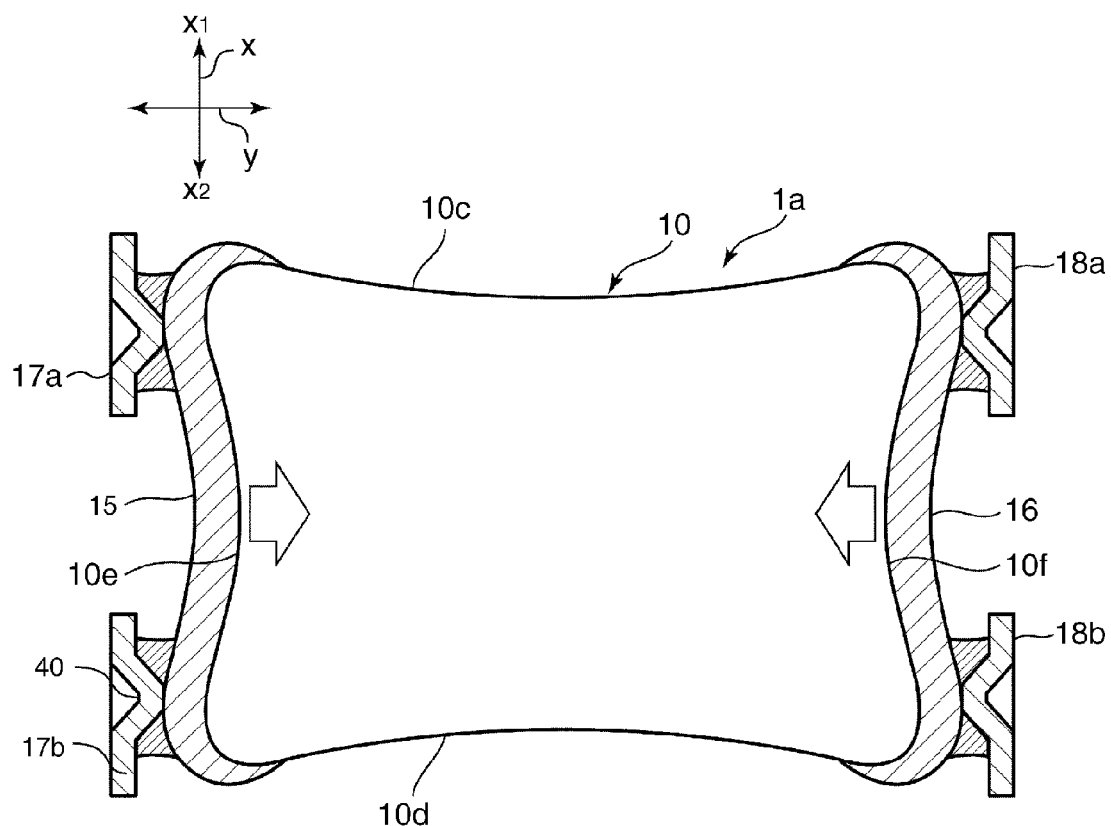
FIG. 15 is schematic sectional view of a capacitor major portion along the first and second directions showing a deformed state of the capacitor major portion according to the second preferred embodiment.

FIG. 12 is a schematic perspective view of an electronic component according to a second preferred embodiment of the present invention. FIG. 13 is a drawing as seen in the direction of arrows XIII-XIII of FIG. 12. FIG. 14 is a drawing as seen in the direction of arrows XIV-XIV of FIG. 13. As shown in FIGS. 12 to 14, in the electronic component according to this preferred embodiment, a first protrusion 40 and a second protrusion 41 protruding toward the first external electrode 15 are disposed on each of the first bonded-to-electrode portion 17a and second electrode-side bonding portion 17b. Likewise, the first protrusion 40 and second protrusion 41 protruding toward the second external electrode 16 are disposed on each of the first electrode-side bonding portion 18a and second bonded-to-electrode portion 18b. In this preferred embodiment, the protrusions 40 and 41 and vicinities thereof are bonded to the first external electrode 15 or second external electrode 16 via the bonding layer 19. Therefore, the first bonded-to-electrode portion 17a and second bonded-to-electrode portion 17b directly make point-contact with the first external electrode 15, and the first bonded-to-electrode portion 18a and second electrode-side bonding portion 18b directly make point-contact with the second external electrode 16. Also, another bonding layer 19 is provided at each of the edges in the first directions x, of the first external electrode 15 and second external electrode 16. For this reason, as shown in FIG. 15, the first bonded-to-electrode portion 17a, second bonded-to-electrode portion 17b, first bonded-to-electrode portion 18a, and second bonded-to-electrode portion 18b are bonded to portions of the capacitor major portion 1a that are less likely to become deformed. As a result, substrate noise is further prevented.

Variations in the distance in the second directions y between the capacitor major portion 1a and first electrode terminal 17 or second electrode terminal 18 are prevented.

In this preferred embodiment, as shown in FIGS. 13 and 14, the first electrode-side bonding portion 17a and second electrode-side bonding portion 17b are bonded to an upper portion and a lower portion in the vertical direction z, of the first external electrode 15 rather than to the central portion thereof in the vertical direction z. Likewise, the first electrode-side bonding portion 18a and second electrode-side bonding portion 18b are bonded to an upper portion and a lower portion in the vertical directions z, of the second external electrode 16 rather than to the central portion thereof in the vertical directions z. As shown in FIG. 5, the central portion in the vertical directions z, of the capacitor major portion 1a is a portion that becomes deformed significantly. On the other hand, both edges in the vertical directions z, of the capacitor major portion 1a are portions that do not become deformed so much. Therefore, by bonding the first bonded-to-electrode portion 17a and second bonded-to-electrode portion 17b to only the upper portion and lower portion in the vertical directions z, of the first external electrode 15 and bonding the first bonded-to-electrode portion 18a and second bonded-to-electrode portion 18b to only the upper portion and lower portion in the vertical directions z, of the second external electrode 16, propagation of vibration of the capacitor major portion 1a to the substrate 2 via the first electrode terminal 17 and second electrode terminal 18 is prevented much more effectively. As a result, substrate noise is prevented much more effectively and satisfactorily.

Third Preferred Embodiment

Figure 16:
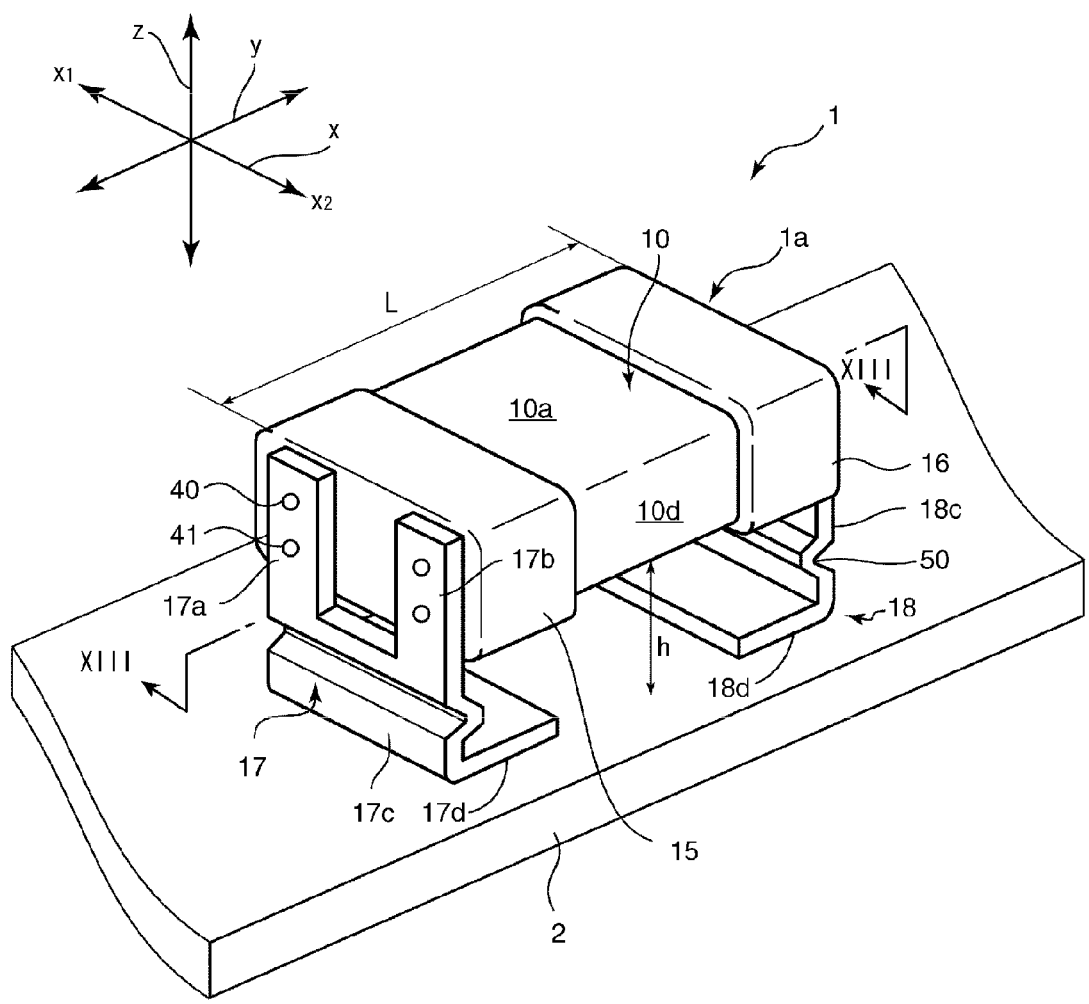
FIG. 16 is a schematic perspective view of an electronic component according to a third preferred embodiment of the present invention.
Figure 17:
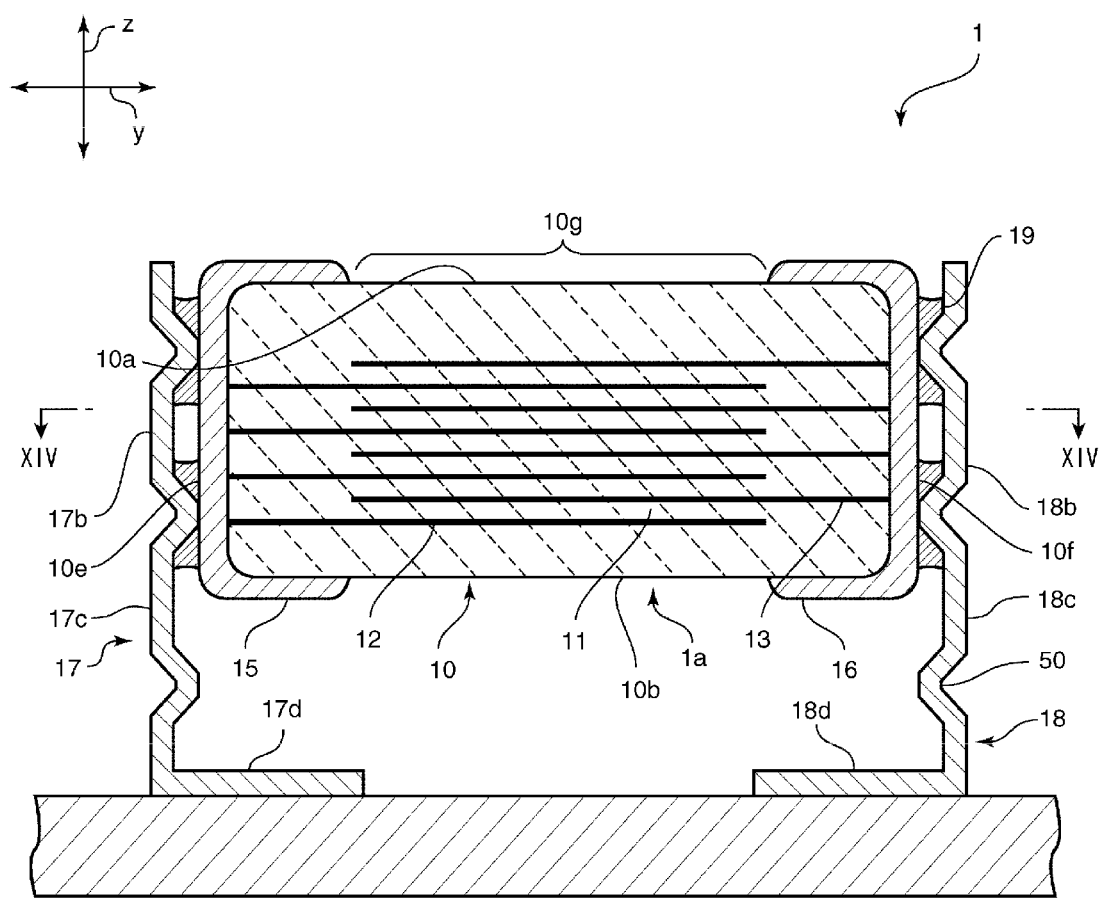
FIG. 17 is a drawing as seen in the direction of arrows XVII-XVII of FIG. 16.
Figure 18:
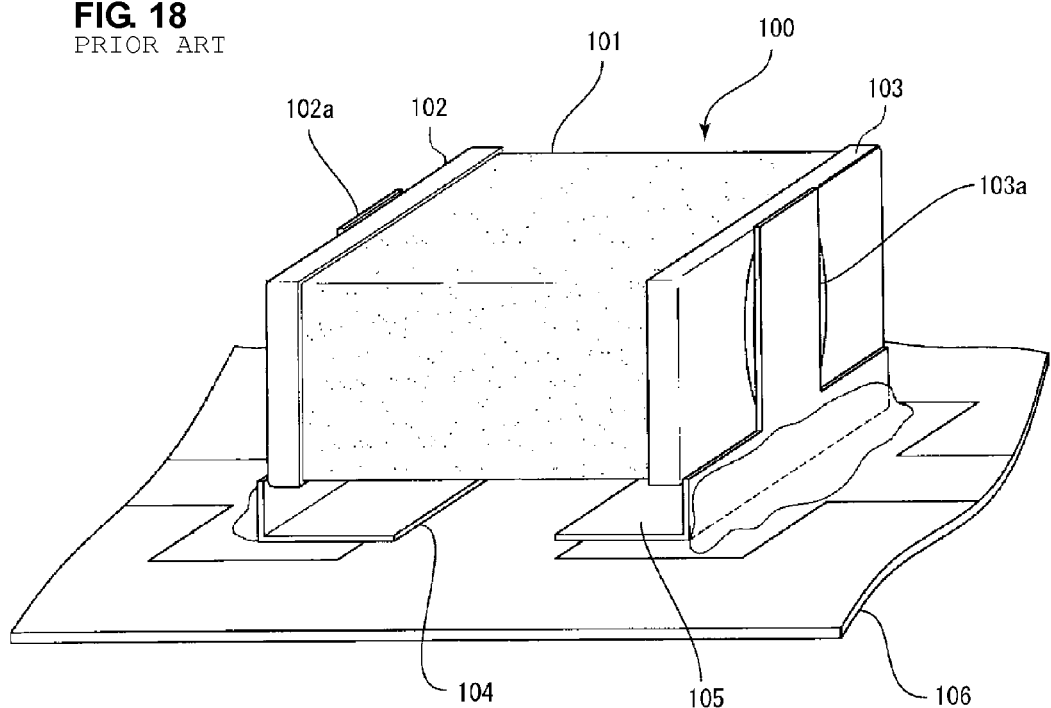
FIG. 18 is a perspective view of a ceramic capacitor disclosed in Japanese Unexamined Patent Application Publication No. 2004-288847.

FIG. 16 is a schematic perspective view of an electronic component according to a third preferred embodiment of the present invention. FIG. 17 is a sectional view along the second directions y, of the electronic component according to the third preferred embodiment. The third preferred embodiment is a modification of the second preferred embodiment. In this preferred embodiment, as shown in FIGS. 16 and 17, a bend 50 that is bent so as to protrude toward one of the second directions y is provided in each of the connecting portions 17c of the first electrode terminal 17 and the connecting portion 18c of the second electrode terminal 18. Thus, vibration of each of the first bonded-to-electrode portion 17a, second electrode-side bonding portion 17b, first bonded-to-electrode portion 18a, and second electrode-side bonding portion 18b is absorbed by the bend 50. For this reason, vibration of the capacitor major portion 1a is even less likely to propagate to the substrate 2. As a result, substrate noise is prevented much more effectively and satisfactorily.

An example where the single bend 50 is provided in each of the connecting portion 17c of the first electrode terminal 17 and the connecting portion 18c of the second electrode terminal 18 has been described in the third preferred embodiment. However, multiple bends may be formed in each of the connecting portions 17c and 18c.

Also, an example where the protruding direction of the bend 50 provided in the connecting portion 17c of the first electrode terminal 17 is opposite to that of the bend 50 provided in the connecting portion 18c of the second electrode terminal 18 has been described in the third preferred embodiment. However, the present invention is not limited to this configuration. For example, the protruding direction of the bend 50 provided in the connecting portion 17c is preferably the same as that of the bend 50 provided in the connecting portion 18c.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A ceramic capacitor for mounting on a substrate, the ceramic capacitor comprising:
   a capacitor body substantially made of a dielectric material, the capacitor having a substantially rectangular parallelepiped shape and including first and second end surfaces, first and second side surfaces, and first and second main surfaces, the first and second end surfaces extending along vertical directions and first directions perpendicular or substantially perpendicular to the vertical directions, the first and second side surfaces extending along second directions and the vertical directions, the second directions being perpendicular or substantially perpendicular to the first directions and the vertical directions, the first and second main surfaces extending along the first directions and the second directions;
   first and second internal electrodes disposed at an interval inside the capacitor body;
   a first external electrode disposed on the first end surface and electrically connected to the first internal electrode;
   a second external electrode disposed on the second end surface and electrically connected to the second internal electrode;
   a first electrode terminal having a first edge bonded to the first external electrode and electrically connected to the first external electrode and having a second edge bonded to the substrate; and
   a second electrode terminal having a first edge bonded to the second external electrode and electrically connected to the second external electrode and having a second edge bonded to the substrate; wherein
   the capacitor body is supported by the first and second electrode terminals at a distance from the substrate;
   each of the first and second electrode terminals includes:
      a bonded-to-substrate portion bonded to the substrate;
      a first bonded-to-electrode portion bonded to an edge in one of the first directions, of one of the first and second external electrodes;
      a second bonded-to-electrode portion bonded to an edge in the other of the first directions, of the one of the first and second external electrodes, the second bonded-to-electrode portion being disposed at a distance from the first bonded-to-electrode portion in the first directions; and
      a connecting portion arranged to connect the first and second bonded-to-electrode portions and the bonded-to-substrate portion;
   where a width along the first directions, of a portion of the ceramic capacitor except for the first and second electrode terminals is represented by $W_O$ and a distance along the first directions between the first and second bonded-to-electrode portions is represented by $W_1$, a ratio of $W_1$ to $W_o$ is about 0.3 or more, and
   where a length along the second directions, of a portion of the ceramic capacitor except for the first and second electrode terminals is represented by L and a distance along the vertical directions between the capacitor body and the substrate is represented by h, a ratio of h to L is about 0.1 or more.

2. The ceramic capacitor according to claim 1, wherein the ratio of $W_1$ to $W_0$ is about 0.5 or less.

3. The ceramic capacitor according to claim 1, wherein the ratio of h to L is about 0.35 or less.

4. The ceramic capacitor according to claim 1, wherein the first internal electrode and the second internal electrode are opposed to each other in the vertical directions.

5. The ceramic capacitor according to claim 1, wherein the first and second bonded-to-electrode portions are each bonded to an upper portion and a lower portion of one of the first and second external electrodes rather than to a central portion in the vertical directions, of the one of the first and second external electrodes.

6. The ceramic capacitor according to claim 1, wherein a protrusion protruding toward one of the first and second external electrodes is provided on portions of the first and second bonded-to-electrode portions, the portions being each bonded to the one of the first and second external electrodes.

7. The ceramic capacitor according to claim 1, wherein a bend that is bent so as to protrude toward one or the other of the second directions is provided in the connecting portion.

8. The ceramic capacitor according to claim 1, wherein none of the first and second bonded-to-electrode portions is bonded to a central portion along the first directions, of one of the first and second external electrodes, and the smaller of a distance between a center in the first directions, of one of the first and second external electrodes and an edge in one of the first directions, of the one of the first and second external electrodes and a distance between the center and an edge in the other of the first directions, of the one of the first and second external electrodes is about 0.15 times or more $W_0$.

9. An electronic component comprising:
a substrate; and
the ceramic capacitor according to claim 1 mounted on the substrate.

* * * * *